United States Patent
Gambino et al.

[19]

[11] Patent Number: 6,025,226
[45] Date of Patent: Feb. 15, 2000

[54] METHOD OF FORMING A CAPACITOR AND A CAPACITOR FORMED USING THE METHOD

[75] Inventors: Jeffrey P. Gambino, Gaylordsville, Conn.; Mark A. Jaso, Manassas, Va.; David E. Kotecki, Hopewell Junction, N.Y.

[73] Assignee: International Business Machines Corporation, Armonk, N.Y.

[21] Appl. No.: 09/007,904

[22] Filed: Jan. 15, 1998

[51] Int. Cl.$^7$ ................................................ H01L 21/8242
[52] U.S. Cl. ......................... 438/244; 438/600; 438/633
[58] Field of Search ..................... 438/131, 243, 438/244, 253, 386, 387, 396, 600, 631, 633, 637

[56] References Cited

U.S. PATENT DOCUMENTS

| | | | |
|---|---|---|---|
| 4,481,283 | 11/1984 | Kerr et al. | 438/396 |
| 4,959,705 | 9/1990 | Lemnios et al. | 257/532 |
| 5,065,273 | 11/1991 | Rajeevakumar | 438/243 |
| 5,262,354 | 11/1993 | Cote et al. | 438/645 |
| 5,322,812 | 6/1994 | Dixit et al. | 438/643 |
| 5,396,094 | 3/1995 | Matsuo | 257/310 |
| 5,406,447 | 4/1995 | Miyazaki | 257/535 |
| 5,459,100 | 10/1995 | Choi | 438/624 |
| 5,479,316 | 12/1995 | Smrtic et al. | 257/532 |
| 5,502,000 | 3/1996 | Look et al. | 438/600 |
| 5,576,240 | 11/1996 | Radosevich et al. | 438/396 |
| 5,602,053 | 2/1997 | Zheng et al. | 438/600 |
| 5,858,833 | 1/1999 | Lee et al. | 438/244 |
| 5,858,834 | 1/1999 | Hirota et al. | 438/253 |
| 5,861,676 | 1/1999 | Yen | 438/633 |

OTHER PUBLICATIONS

Vertical Capacitor VLSI Structure for High Voltage Applications; IBM Technical Disclosure Bulletin, vol. 32 (7), 37–41 (1989).

J.H. Ha et al., Reduction of Loading Effect by Tungsten Etchback in a Magnetically Enhanced Reactive Ion Etcher, IEEE Transactions on SEmiconductor Mfg., vol. 9 (2), 289–91 (1996).

C. Hu, Interconnect Devices for Field Programmable Gate Array, IEDM, 591–94 (1992).

S. Chiang et al, Antifuse Structure for Field Programmable Gate Arrays, IEDM, 611–14 (1992).

K.E. Gordon et al.,Conducting Filament of the Programmed Metal Electrode Amorphous Silicon Antifuse, IEDM, 27–30 (1993).

U.S. application No. 08/752,137, filed Nov. 19, 1996, entitled: "Advanced Damascene Planar Stack Capacitor Fabrication Method", IBM Docket # HQ9–96–013.

*Primary Examiner*—Chandra Chaudhari
*Attorney, Agent, or Firm*—Ratner & Prestia

[57] ABSTRACT

An integrated circuit including a capacitor and a method of manufacturing the capacitor simultaneously while forming a dual damascene via. A first interconnect layer is formed upon a first interlevel dielectric. Openings corresponding to vias and capacitors extend through a second interlevel dielectric to the first interconnect layer. A conductor is deposited in the via openings. An insulator is deposited in the openings and on the conductor in the via openings. A trench is then etched into the upper portion of the via openings while simultaneously removing the insulator from the conductor in the via openings. A conductor is then deposited in the openings and in the trenches and chemical-mechanical polishing (CMP) is used to pattern the conductor. A third interlevel dielectric is then deposited, openings are formed extending to the conductors, and third interconnect layer conductors are deposited and patterned.

28 Claims, 10 Drawing Sheets

METHOD OF FORMING A CAPACITOR AND A CAPACITOR FORMED USING THE METHOD

TECHNICAL FIELD

This invention relates generally to the formation of an integrated circuit including a capacitor. More specifically, this invention relates to the simultaneous formation of a via and a capacitor in an integrated circuit.

BACKGROUND OF THE INVENTION

Capacitors are often used in integrated circuits. In many applications, as in analog-to-digital converters for example, it is desirable for capacitance not to vary with changes in voltage. A capacitor formed of metal-insulator-metal layers can provide a capacitance that does not vary with voltage. A conventional method of manufacturing a metal-insulator-metal capacitor is described by Radosevich et al. in U.S. Pat. No. 5,576,240.

A conventional method of manufacturing a semiconductor apparatus 5 including a capacitor 10 that is formed of metal-insulator-metal layers is described with reference to FIG. 2. A field oxide layer 11 is formed on a substrate 18. A polysilicon layer 12 is formed upon the field oxide layer 11 and an interlevel dielectric 13 is formed upon the field oxide layer 11 and the polysilicon layer 12. Openings are formed in the interlevel dielectric 13 in which a capacitor 10 and a contact via 19 are formed.

The bottom plate 14 is formed by depositing a titanium layer 14a and a titanium nitride layer 14b in the openings in the interlevel dielectric layer 13. The capacitor dielectric 15 is then deposited in both openings. The capacitor dielectric 15 is removed from the contact via 19 by masking and etching. An aluminum layer 17 is deposited. The aluminum layer 17 is then patterned by masking and etching.

The method of manufacturing a conventional semiconductor apparatus 5 including a capacitor 10 as described above uses masking and etching to remove the capacitor dielectric 15 from the contact via 19. Each mask and etch is performed using lithography which is a relatively expensive step in manufacturing a semiconductor apparatus.

Antifuses are often used in programmable logic chips and write-once memories. Antifuses are usually located between conductive interconnects in an integrated circuit. The structure of an antifuse is typically an insulating layer sandwiched between two conductive layers. When manufactured, an antifuse has a very high resistance and can often be treated as an open circuit. An antifuse can be transformed, however, from its manufactured state into an element having a low resistance. A transformed antifuse can often be treated as a short circuit.

An antifuse may be transformed from a high resistance state to a low resistance state by applying a programming voltage between the two conducive layers across the insulating layer. The voltage gradient across the insulator causes a reaction between the insulator and one or both of the conductors which breaks down the insulator.

A method of manufacturing a conventional semiconductor device including an antifuse is described by Dixit et al. in U.S. Pat. No. 5,322,812. The manufacture of a conventional semiconductor apparatus 40 including an antifuse 45 having metal-insulator-metal layers is described with reference to FIG. 1. A first insulating layer 51 is formed on a substrate 50. A polysilicon layer 60 and then a metal silicide layer 66 are formed upon the first insulating layer 51. A second insulating layer 61 is deposited over the substrate 50, over the first insulating layer 51, and over the metal silicide layer 66. Holes are formed in the second insulating layer 61 by masking and etching. The antifuse 45 is formed in one hole, and standard contacts 46, 47 are formed in two additional holes.

A contact reflow and oxidation step rounds the edges of the second insulating layer 61 and forms an oxide layer (not shown) on the substrate 50 and on the silicide 66 in the holes in the second insulating layer 61. A mask is then used in removing the oxide layer from the hole for the antifuse 45.

An amorphous silicon layer 67 is then deposited over the second insulating layer 61 and in the holes in the second insulating layer 61. A mask and etch are used to remove the amorphous silicon layer 67 from the holes for the standard contacts 46, 47. The oxide layer is then removed from the holes for the standard contacts 46, 47 by etching. A barrier metal layer 68 and aluminum alloy layer 69 are then formed. The metal layers 68, 69 are then etched to define metal conducting lines for the antifuse 45 and standard contacts 46, 47.

The conventional method of manufacturing a semiconductor apparatus 40 including an antifuse 45 as described above uses masking and etching to form holes in the second insulating layer 61, to remove the oxide layer from the antifuse 45, to remove the amorphous silicon layer 67 from the holes for the standard contacts 46, 47, and to define the conducting lines in the metal layers 68, 69. Each mask and etch is performed using lithography which is a relatively expensive step in manufacturing a semiconductor apparatus.

To overcome the shortcomings of manufacturing a conventional capacitor, a new method of manufacturing a capacitor is provided. An object of the present invention is to provide an improved method of manufacturing an integrated circuit including a capacitor. A related object is to reduce the number of mask steps in manufacturing an integrated circuit including a capacitor. A further object is to reduce the cost of manufacturing an integrated circuit including a capacitor. Another object is to reduce the lithography steps in manufacturing an integrated circuit including a capacitor.

SUMMARY OF THE INVENTION

To achieve these and other objects, and in view of its purposes, the present invention provides an integrated circuit including a capacitor and a method of manufacturing the capacitor. The capacitor according to the present invention is manufactured by forming a conductive interconnect upon a first interlevel dielectric. A second interlevel dielectric is deposited upon the conductive interconnect. An opening is formed in the second interlevel dielectric. The opening has sidewalls and a bottom and extends through the second interlevel dielectric to the conductive interconnect. An insulator is then deposited upon the second interlevel dielectric and upon the sidewalls and bottom of the opening. A conductor is then deposited upon the insulator, filling the opening.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Apparatus

Figure 1:
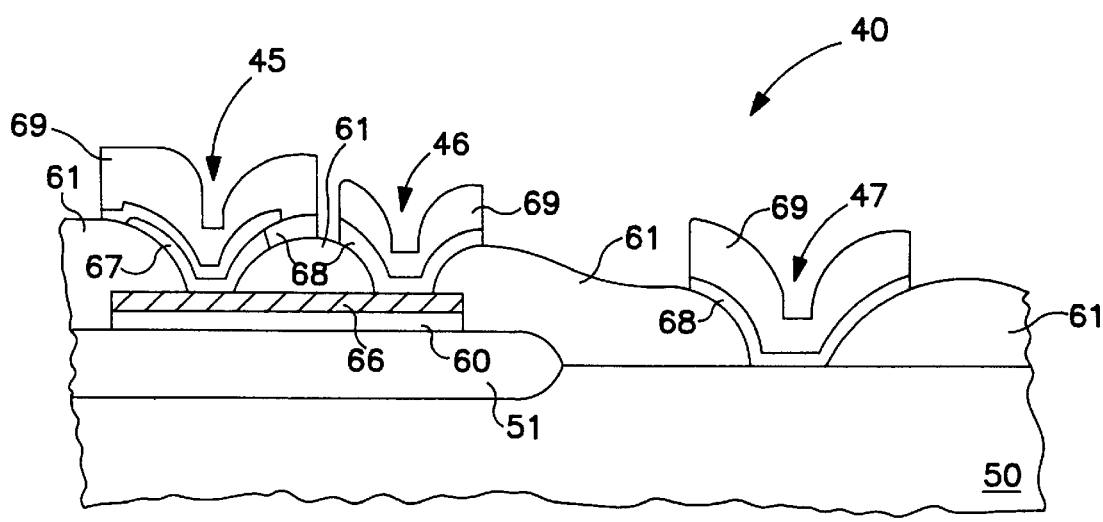
FIG. 1 is a sectional view illustrating a conventional semiconductor apparatus including an antifuse.
Figure 2:
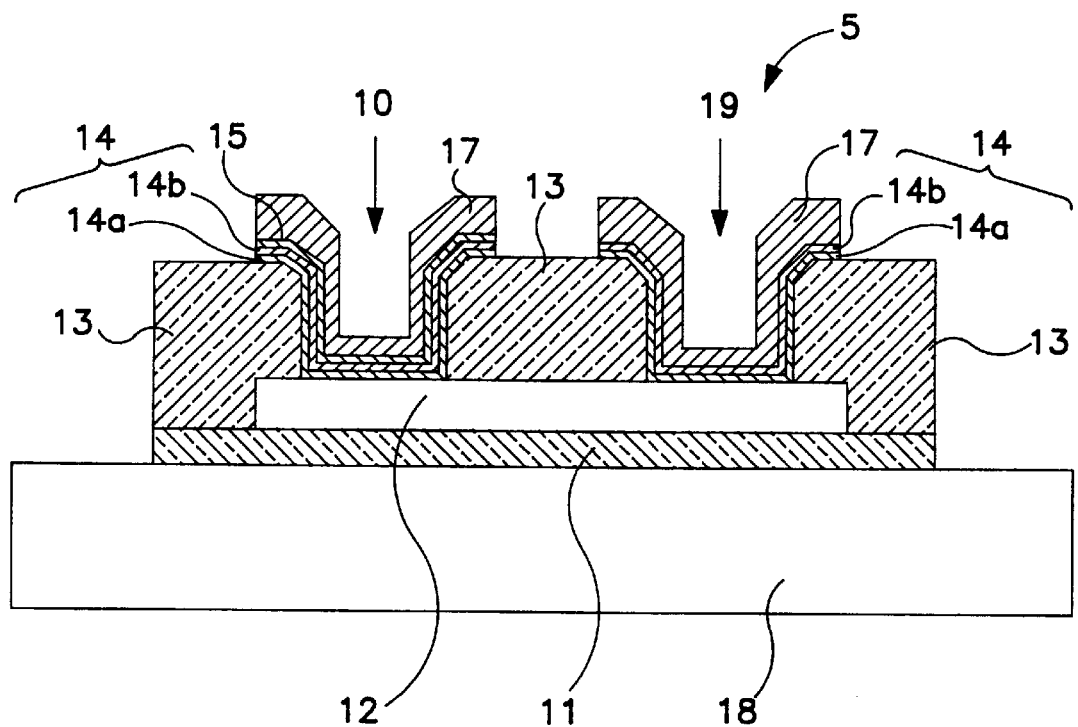
FIG. 2 is a sectional view illustrating a conventional semiconductor apparatus including a capacitor.
Figure 3:
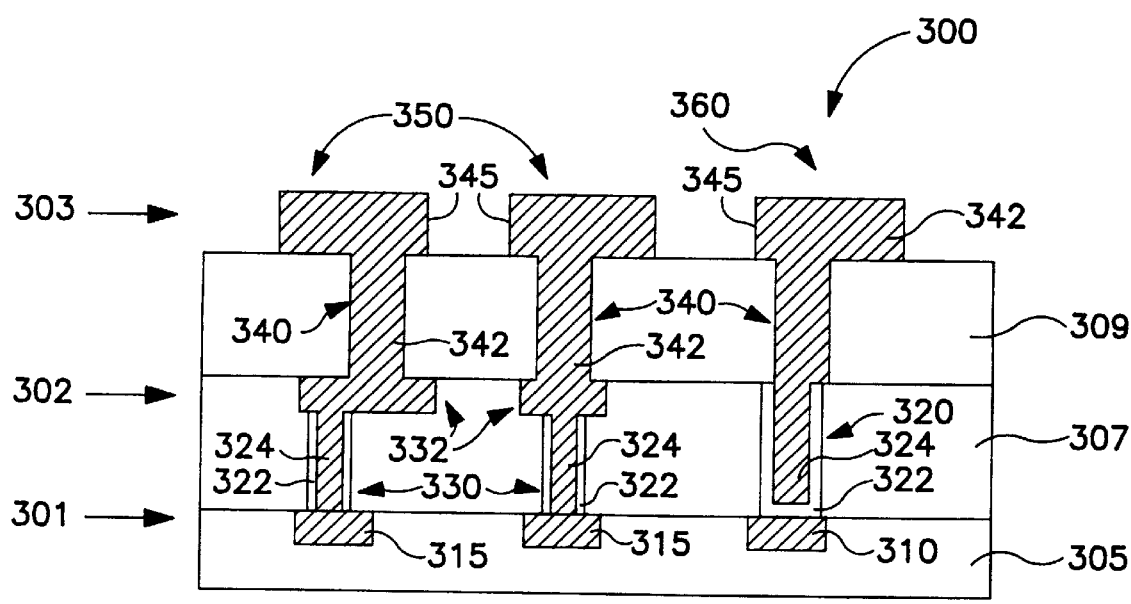
FIG. 3 is a sectional view of an integrated circuit according to the present invention.

Referring now to the drawing, wherein like reference numerals refer to like elements throughout, FIG. 3 shows an apparatus 300 including a conductor-insulator-conductor device 360 according to an embodiment of the invention. A first interconnect layer 301 is formed upon or in a first interlevel dielectric 305. The first interconnect layer 301 includes a first conductive interconnect 310 and second conductive interconnects 315. In an exemplary embodiment, as shown in FIG. 3, the first interconnect layer 301 including the first and second conductive interconnects 310, 315 is formed by a damascene process. The first interconnect layer 301 may also be formed upon the dielectric layer 305 by etching. The meaning of the term "upon", when used hereafter with reference to forming an interconnect layer such as the first interconnect layer 301 or with reference to forming interconnects such as first or second conductive interconnects 310, 315, means that the interconnects or the interconnect layer are formed by either a damascene process or by etching.

A first opening 320 extending through a second interlevel dielectric 307 to the first conductive interconnect 310 is coated with an insulator 322 and filled with a first conductor 324. Second openings 330 extend through the second interlevel dielectric 307 between the second conductive interconnects 315 and trenches 332. The sidewalls of the second openings 330 may be coated with the insulator 322. The second openings 330 and the trenches 332 are filled with the first conductor 324.

Third openings 340 extend through the third interlevel dielectric 309 to the first conductor 324 at the second interconnect layer 302 in either a trench 332 or in a first opening 320. The third openings 340 are filled with a second conductor 342. A third interconnect layer 303 is formed upon the third interlevel dielectric 309. The third interconnect layer 303 includes third conductive interconnects 345, each upon a third opening 340 and comprised of the second conductor 342. As shown in FIG. 3, the third conductive interconnects 345 are formed as they would be for the case where the third interconnect layer 303 is the final interconnect layer of the apparatus 300. As shown in FIG. 3, the first and second conductive interconnects 310, 315 are at a first interconnect layer 301, the trenches 332 filled with the first conductor 324 may be interconnects at the second interconnect layer 302, and the third conductive interconnects 345 are interconnects at a third interconnect layer 303.

The apparatus 300 includes elements 350 and device 360. Elements 350 may be used as conductive vias. As shown in FIG. 3, a conductive path is formed between the third conductive interconnects 345 and corresponding second conductive interconnects 315.

Device 360 comprises a conductor-insulator-conductor. The conductive interconnects 310, 345 of device 360 are isolated by an insulator 322. Device 360 may be designed to function, for example, as a capacitor or as an antifuse. The size of the first opening 320 may vary depending on the function of the device. For example, when device 360 is to function as an antifuse, the first opening 320 may have a diameter as small as the technology used to form the first opening 320 permits. For example, the first opening 320 may be formed using lithography and have a diameter of 0.2 $\mu$m. Preferably, the first opening 320 has a diameter less than 0.3 $\mu$m. A smaller first opening 320 diameter results in a smaller device 360 and provides an advantage of using less area on an integrated circuit which allows an increased device density. When the device 360 is to function as a capacitor, the first opening 320 may have a diameter corresponding to a desired capacitance of the device 360. The material forming the device 360 will vary depending on the function of the device and particular design parameters associated with that function.

Multi-layer stacks may be used for the first and second conductive interconnects 310, 315 at the first interconnect layer 301, the third conductive interconnects 345 at the third interconnect layer 303, and for interconnects in the trenches 332 at the second interconnect layer 302. A multi-layer stack may be used for better adhesion to an underlying layer and/or for improved control of lithography.

Preferably, the conductors on both sides of the insulator 322 layer are compatible with the insulator 322. As known to those skilled in the art, materials are chosen to cause a reaction between the insulator 322 and one or both of the conductors when a voltage is applied between conductors. This reaction causes a break down of the insulator 322 resulting in a decrease in insulator 322 resistance.

Examples of materials used in manufacturing a device 360 as an antifuse are discussed below. When the device 360 is to function as an antifuse, the first interconnect layer 301 including the first and second conductive interconnects 310, 315 preferably is comprised of Aluminum, Tungsten, TiN, TiW, or silicide. Common thicknesses for the first and second conductive interconnects 310, 315 range from 0.1–2.0 $\mu$m. The thickness will vary according to particular design parameters. A thicker conductive interconnect 310, 315 has a lower resistance and a higher capacitance.

In a preferred embodiment, the second interlevel dielectric 307 is silicon dioxide ($SiO_2$). Examples of insulators 322 are $SiO_2$, $Si_xN_y$, and silicon (Si) Preferably, a first conductive interconnect 310 made of Aluminum, Tungsten, Titanium, TiN, TiW, or silicides will be used with an insulator 322 made of $SiO_2$ or $Si_xN_y$. Preferably, a first conductive interconnect 310 made of Tungsten, TiN, TiW, or silicides will be used with an insulator 322 comprised of silicon. The first conductive interconnect 310 may be a multi-layer stack such as Ti/Al/TiW, for example, in combination with an insulator 322 made of silicon. Optimal insulator 322 thickness depends on the device type being manufactured and the desired device characteristics. For example, a thicker insulator reduces the leakage current and increases the antifuse lifetime, but it also increases the programming voltage.

Preferably, a first conductor 324 comprised of Al, Cu, W, Ti, TiN, or silicides will be used with an insulator 322 comprised of $SiO_2$ or $Si_3N_4$, and a first conductor 324 comprised of W, Ti, TiN, or suicides will be used with an insulator 322 comprised of silicon. An interconnect at the second interconnect layer 302 formed in a trench 332 may be comprised of a multi-layer stack, such as TiW/Al when the insulator 322 is Si, for example. Preferably, the second conductor 342 is comprised of Al or Al-based multi-layers.

Examples of materials used in manufacturing a device 360 as a capacitor are discussed below. When the device 360 is to function as a capacitor, the first and second conductive interconnects 310, 315 may be comprised of Aluminum, Tungsten, TiN, TiW, Pt, or silicide, for example. Common thicknesses for the first and second conductive interconnects 310, 315 range from 0.1–2.0 $\mu$m. The thickness will vary according to particular design parameters. A thicker conductive interconnect 310, 315 has a lower resistance and a higher capacitance.

In a preferred embodiment, the second interlevel dielectric 307 is silicon dioxide. Preferably, the insulator 322 thickness ranges from 5–200 nm and is comprised $SiO_2$, $Si_xN_y$, $Ta_2O_5$, or $BaSrTiO_3$ (barium strontium titanate) A thickness of 10 nm is preferred for an insulator 322 of $SiO_2$ and a thickness of 20 nm is preferred for an insulator 322 of $BaSrTiO_3$. Optimal insulator 322 thickness depends on the device type being manufactured and the desired device characteristics. For example, a thicker insulator reduces the leakage current and increases the capacitor lifetime, but also reduces the capacitance.

Preferably a first conductive interconnect 310 comprised of Aluminum, Tungsten, Titanium, TiN, or silicides will be used with an insulator 322 comprised of $SiO_2$ or $Si_3N_4$, a first conductive interconnect 310 comprised of silicides will be used with an insulator 322 comprised of $Ta_2O_5$, and a first conductive interconnect 310 comprised of Pt will be used with an insulator 322 comprised of $BaSrTiO_3$. The first conductive interconnect 310 may be a multi-layer stack such as Ti/Al/TiN.

Preferably, a first conductor 324 comprised of Al, W, Ti, TiN, or silicides is used with an insulator 322 comprised of $SiO_2$, or $Si_3N_4$, a first conductor 324 comprised of silicides is used with an insulator 322 comprised of $Ta_2O_5$, and a first conductor 324 comprised of Pt is used with an insulator 322 comprised of $BaSrTiO_3$.

Figure 28:
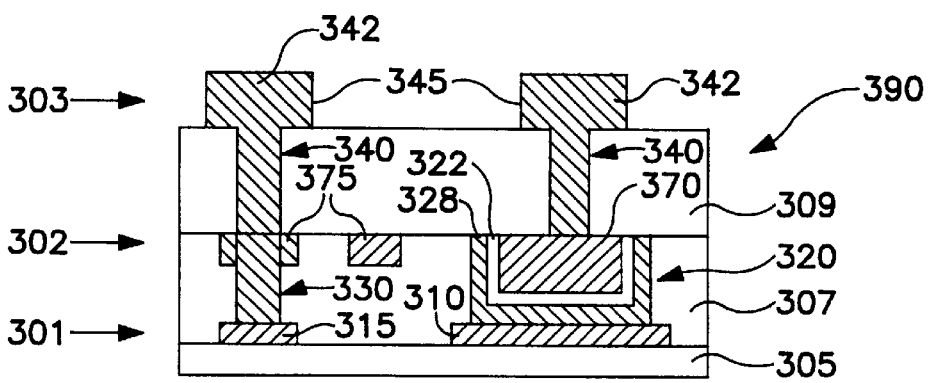

Another embodiment of the present invention is illustrated in the apparatus 390 shown in FIG. 28. Differences from the apparatus 300 are described below. The sidewalls and bottom of the first opening 320 are coated with a third conductor 328. The insulator 322 coats the third conductor 328 and a fourth conductor 370 disposed upon the insulator 322 fills the first opening 320. The second opening 330 of the apparatus 390 does not have an insulator 322 coating its sidewalls. The second conductor 342 in the third opening 340 corresponding to the first opening engages the fourth conductor 370 in the first opening 320.

Methods of Manufacture

Figure 4:
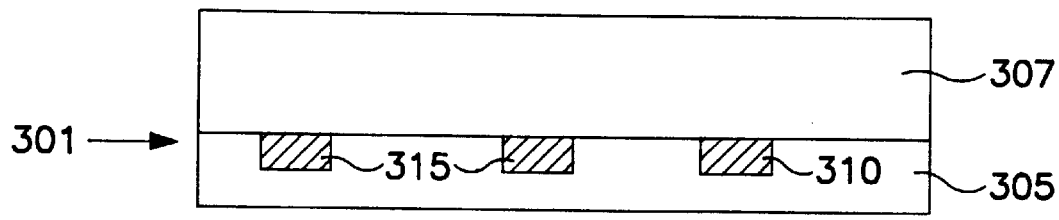
FIGS. 4–10 are sectional views illustrating a method of manufacture according to a first embodiment of the present invention.

A method of manufacturing an apparatus 300 according to a first embodiment of the present invention is described below with reference to FIGS. 4–10. A first interconnect layer 301 including a first conductive interconnect 310 and second conductive interconnects 315 is formed upon a first interlevel dielectric 305. In a preferred embodiment, as shown in FIG. 4, the first and second conductive interconnects 310, 315 are formed within the first interlevel dielectric 305 by a damascene process. The first and second conductive interconnects 310, 315 may also be formed by depositing a conductor upon the first interlevel dielectric 305 and patterning the interconnects by etching.

Figure 5:
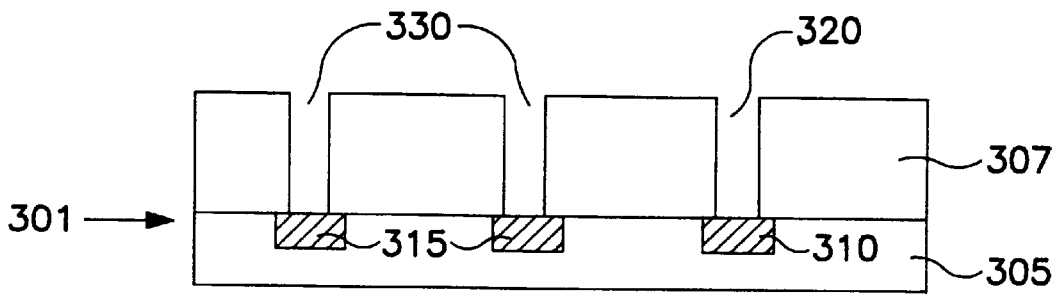

A second interlevel dielectric 307 is deposited upon the first interlevel dielectric 305 and upon the first and second conductive interconnects 310, 315. The second interlevel dielectric 307 may then be planarized. As shown in FIG. 5, the second interlevel dielectric 307 is patterned to form a first opening 320 and second openings 330 that extend down to the first and second conductive interconnects 310, 315, respectively. The first and second openings 320, 330 may be formed in the second interlevel dielectric 307 using lithography and reactive ion etching (RIE).

Figure 6:
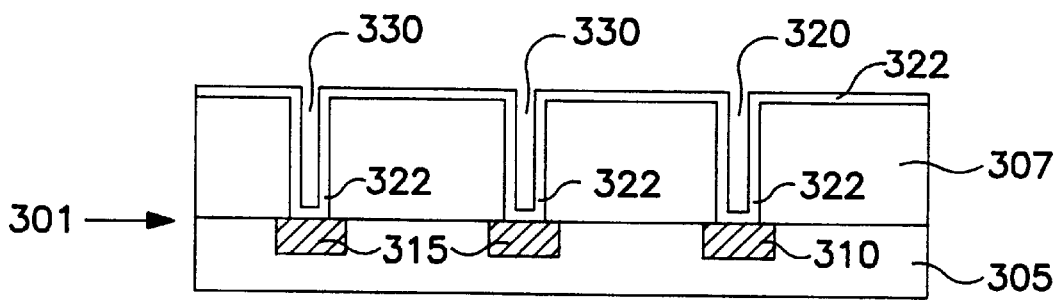

As shown in FIG. 6, an insulator 322 is then deposited. The methods for depositing the insulator 322 include physical vapor deposition (PVD), chemical vapor deposition (CVD), or plasma enhanced chemical vapor deposition (PECVD). Highly conformal deposition methods such as PECVD and CVD are preferred to deposit the insulator 322 to ensure adequate coverage of the bottom of the first opening 320. If PVD is used to deposit the insulator 322, it may be necessary to taper the sides of the first opening 320 to adequately cover the bottom of the first opening 320 with the insulator 322. As described above with reference to an apparatus 300 according to the present invention, the first and second conductive interconnects 310, 315 may be multi-layer stacks and should be compatible with the insulator 322.

Figure 7:
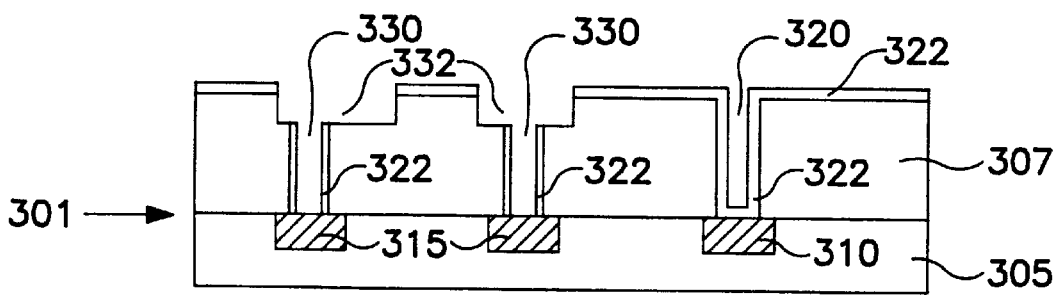

As shown in FIG. 7, trenches 332 are formed in the upper portions of the openings 330. The trenches 332 may be formed using lithography and RIE, for example. The opening 320 and the insulator 322 in the opening 320 are protected by a resist (not shown) while the trenches 332 are formed. The insulator 322 is removed from the bottoms of the openings 330 while the trenches 332 are being formed. Preferably, the trenches 332 have a width greater than the width of the openings 330 and do not extend into the second interlevel dielectric 307 to the depth of the second conductive interconnects 315. Trenches 332 narrower than second openings 330 result in a reduced contact area at the bottom of the second openings 330 and in a higher contact resistance.

The trench 332 formation serves a dual function by forming trenches 332 which are later filled with a conductor and used as interconnects and also removing the insulator 322 from the bottoms of openings 330. This dual-purpose step eliminates the need for an additional step to pattern the insulator 322.

Figure 8:
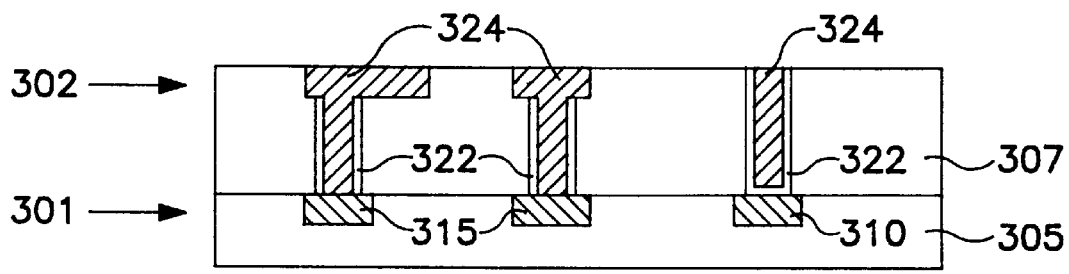

As shown in FIG. 8, a conductor 324 is deposited in the openings 320, 330 and patterned. In a preferred embodiment, the conductor 324 is patterned by chemical-mechanical polishing (CMP) to form dual damascene vias in the openings 330. The CMP process removes the deposited conductor 324 that overfilled the openings 320, 330 and that was deposited upon the second interlevel dielectric 307. In a preferred embodiment, the CMP process also removes the insulator 322 upon the second interlevel dielectric 307 as shown in FIG. 8.

The insulator 322 on the sidewalls of the openings 330 may be removed by a chemical dry etching process or by a wet etching process before the conductor 324 is deposited. Even if this additional step is required, the method according to this invention still results in a cost savings over conventional methods because a chemical dry etching step, for example, is relatively inexpensive compared to a lithography step. Removal of the insulator 322 from the sidewalls of the openings 330 will increase the amount of conductor 324 that may be deposited into the openings and reduce the resistance of the conductive path between the second conductive interconnects 315 and the conductor 324 in the trenches 332. The insulator 322 on the sidewalls may also be removed to increase the size of the second opening 330 and, therefore, to reduce conductor 324 filling problems. This extra step may be avoided by designing larger-sized openings 330 to account for the insulator 322 on the sidewalls.

Figure 9:
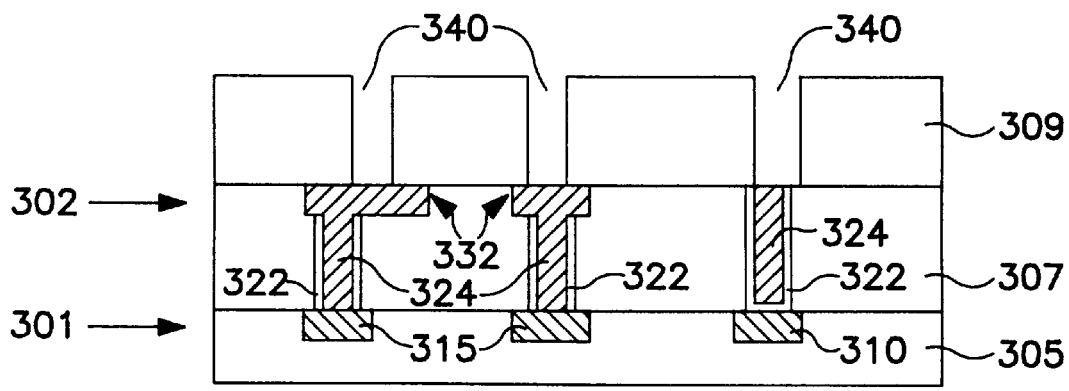

As shown in FIG. 9, a third interlevel dielectric 309 is deposited upon the second interlevel dielectric 307, upon the conductor 324 in the first and second openings 320, 330, and upon the insulator 322 on the sidewalls of the first opening 320. Third openings 340 are formed in the third interlevel dielectric 309. The third openings 340 are preferably formed by lithography and RIE. Each third opening 340 extends through the third interlevel dielectric 309 to the conductor 324 in either one of the trenches 332 or to the conductor 324 in the opening 320.

Figure 10:
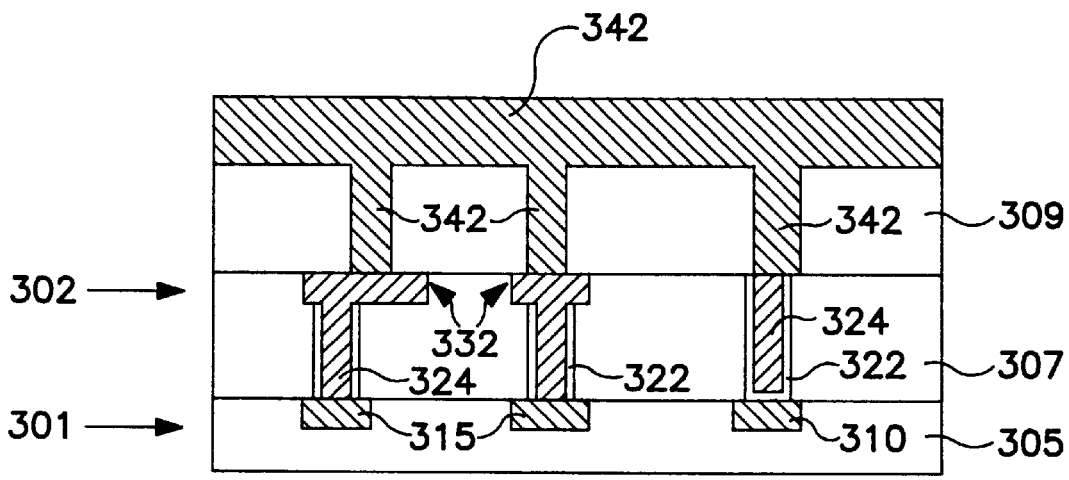

As shown in FIG. 10, a second conductor 342 is deposited upon the third interlevel dielectric 309, filling the third openings 340. The second conductor 342 is then patterned to form a third interconnect layer 303. When the third interconnect layer 303 is not the final interconnect layer, it may be patterned by CMP, for example. When the second conductor 342 is to be formed into the final interconnect layer of the apparatus 300, the second conductor 342 is patterned into a third interconnect layer 303 including third conductive interconnects 345 as shown in FIG. 3. Preferably, third conductive interconnects 345 are formed by lithography and RIE.

Figure 11:
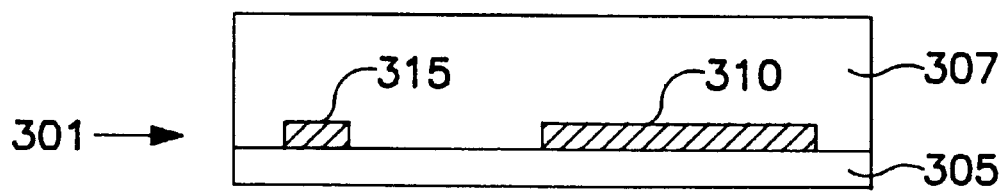
FIGS. 11–20 are sectional views illustrating a method of manufacture according to a second embodiment of the present invention.

A method of manufacturing an apparatus 300 according to a second embodiment of the present invention is described below with reference to FIGS. 11–20. A first conductive interconnect 310 and a second conductive interconnect 315 are formed upon a first interlevel dielectric 305. As shown in FIG. 11 and described above with reference to FIG. 4, the first and second conductive interconnects 310, 315 may be formed by depositing a conductor upon the first interlevel dielectric 305 and patterned by etching.

Figure 12:
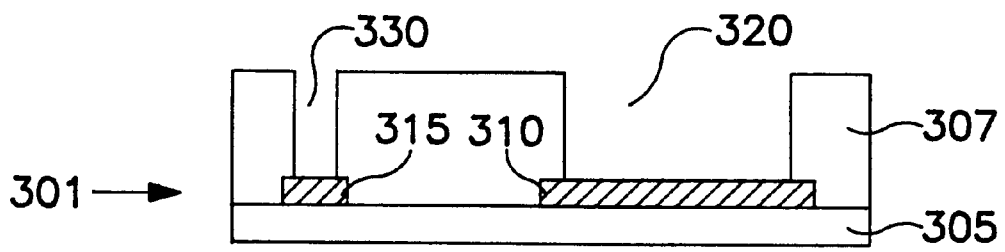

A second interlevel dielectric 307 is deposited upon the first interlevel dielectric 305 and upon the first and second conductive interconnects 310, 315. The second interlevel dielectric 307 may then be planarized. As shown in FIG. 12 and described above with reference to FIG. 5, the second interlevel dielectric 307 is patterned to form a first opening 320 and at least one second opening 330 that extend down to the first and second conductive interconnects 310, 315 respectively. The second interlevel dielectric 307 may be patterned using lithography and reactive ion etching (RIE)

Figure 13:
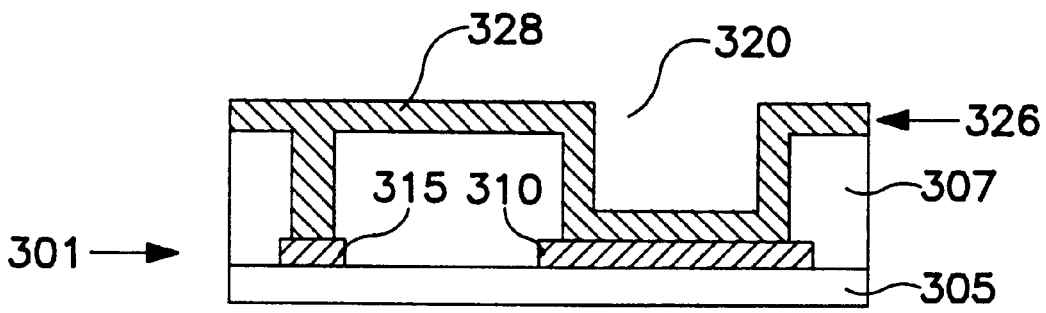

As shown in FIG. 13, a blanket layer 326 of a third conductor 328 is deposited. Preferably, the blanket layer 326 of the third conductor 328 is sufficiently thick to fill the second opening 330 and sufficiently thin to not planarize the first opening 320. The third conductor 328 may be deposited to overfill the second opening 330. Preferably, the third conductor 328 is deposited using a highly conformal deposition technique such as PVD, CVD, and PECVD. The third conductor 328 may be comprised of Tungsten, Aluminum, Copper, or Gold. The third conductor 328 may also be a multilayer stack such as Ti/Al/TiN, TiN/Al/TiN, or Ti/Al/Ti.

Figure 14:
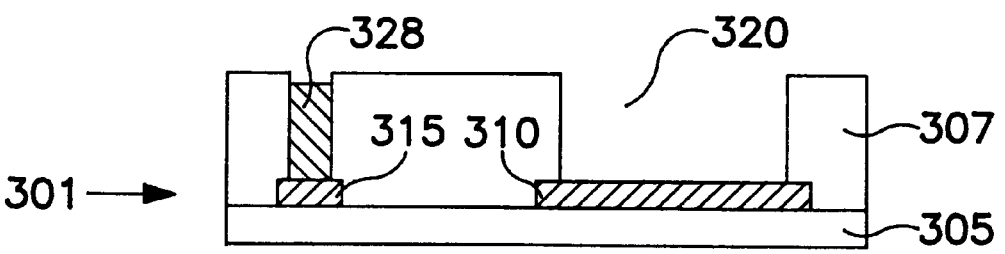

The third conductor 328 is then partially removed as shown in FIG. 14. In a preferred embodiment, the third conductor 328 is removed using isotropic dry etching in SF6 as taught by J. H. Ha et al., Reduction of Loading Effect by Tungsten Etchback in a Magnetically Enhanced Reactive Ion Etcher, IEEE Transactions on Semiconductor Manufacturing, Vol. 9 (2), 289–291 (1996). Preferably, the etching of the third conductor 328 is selective to the third conductor 328 so there is minimal overetching into the first conductive interconnect 310.

Figure 15:
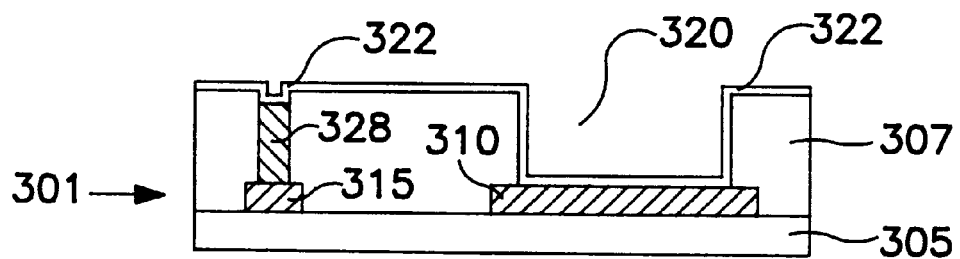

As shown in FIG. 15, an insulator 322 is deposited upon the second interlevel dielectric 307, upon the first conductive interconnect 310 at the bottom of the first opening 320, upon the third conductor 328, and in the second opening 330. The insulator 322 may be deposited by methods including PVD, CVD, or PECVD. Highly conformal deposition methods such as PECVD or CVD are preferred to deposit the insulator 322 to ensure adequate coverage of the bottom of the first opening 320. As described above with reference to an apparatus 300 according to the present invention, the first and second conductive interconnects 310, 315 of the first interconnect layer 301 may be multi-layer stacks and should be compatible with the insulator 322.

Figure 16:
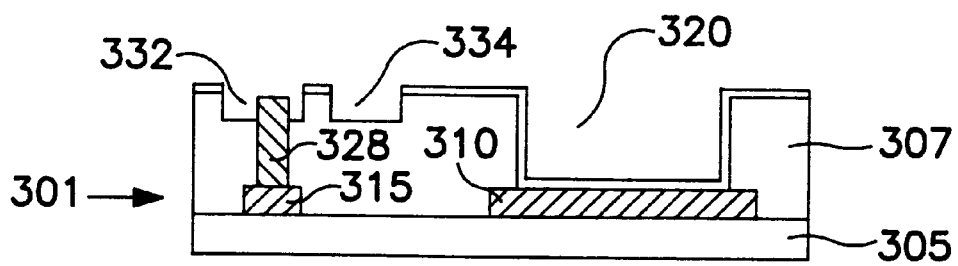
Figure 17:
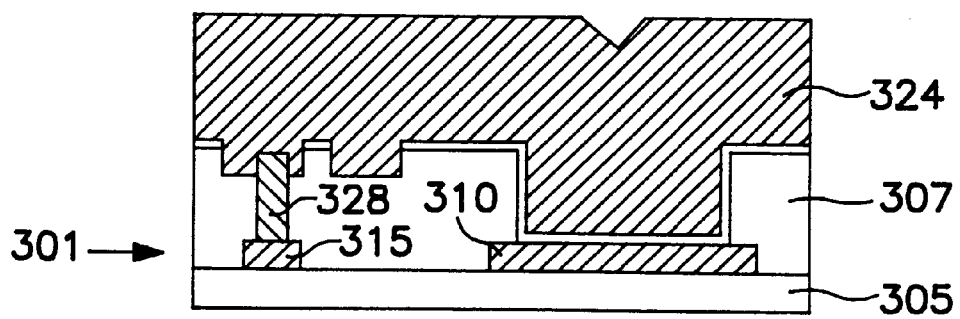

As shown in FIG. 16, a trench 332 is formed in the upper portion of the opening 330 that extends to the second conductive interconnects 315. An additional trench 334 is simultaneously formed. The trenches 332, 334 may be used as interconnects on the second interconnect layer 302. This additional trench 334 does not connect to a second conductive interconnect 315 in the cross sectional view of FIG. 16, and it may be used solely as an interconnect. The trenches 332, 334 may be formed using lithography and RIE, for example. The opening 320 and the insulator 322 in the opening 320 are protected by a resist (not shown) while the trenches 332, 344 are formed. The etching process used to form the trenches 332, 334 also removes the insulator 322 from the bottom of the opening 330 above the third conductor 328. Preferably, the trench 332 has a width greater than the width of the opening 330 and does not extend into the second interlevel dielectric 307 to the depth of the second conductive interconnect 315 of the first interconnect layer 301.

The trench 332 formation serves a dual function by forming trenches 332, 334 which are later filled with a conductor and used as interconnects and also removing the insulator 322 from the opening 330. This dual-purpose step eliminates the need for an additional step to pattern the insulator 322.

Figure 18:
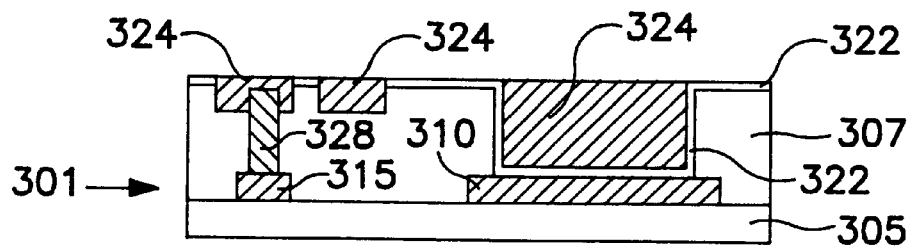
Figure 19:
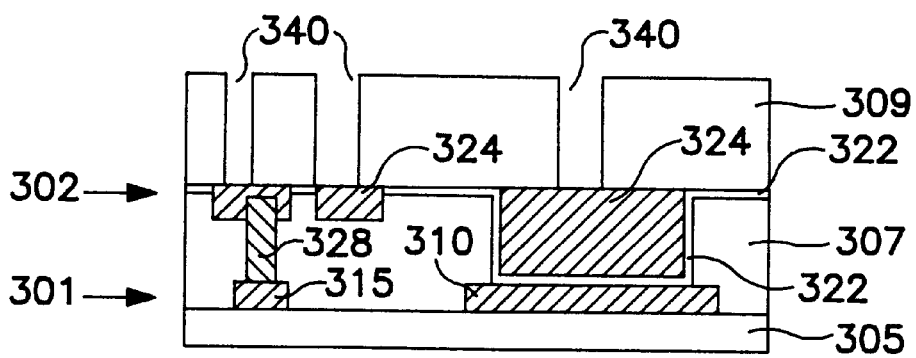
Figure 20:
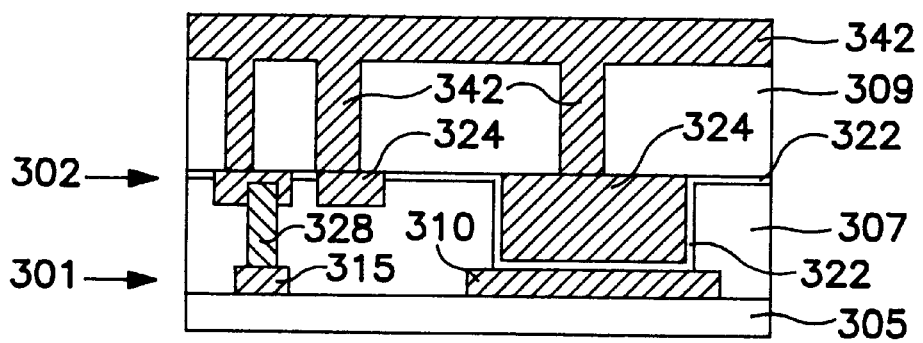

The remaining steps as illustrated in FIGS. 17–20 are similar to the method described above with respect to FIGS. 8–10 and for brevity will not be repeated. Note that, according to design parameters for a particular apparatus 300, the CMP process does not necessarily remove all the insulator 322 from the surface of the second interlevel dielectric 307 as shown in FIGS. 18–20.

Figure 21:
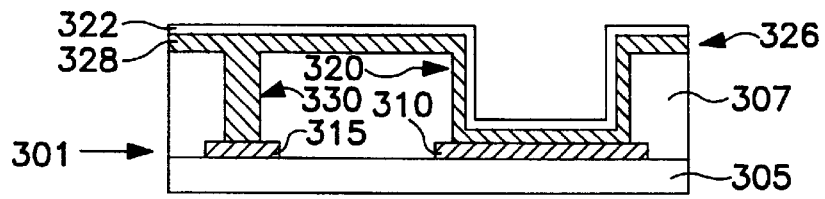
FIGS. 21–28 are sectional views illustrating a method of manufacture according to a third embodiment of the present invention.
Figure 22:
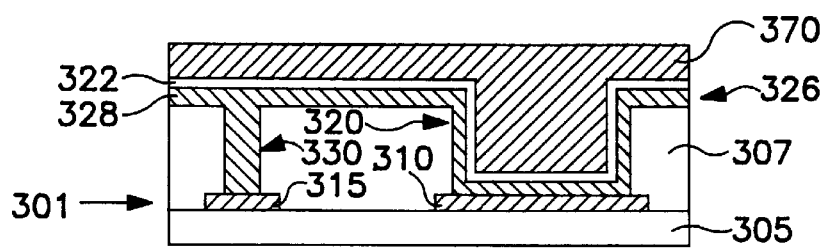

A method of manufacturing an apparatus 390 according to a third embodiment of the present invention is described below with reference to FIGS. 21–28. The apparatus shown in FIG. 13 is formed according to the second embodiment of the present invention described above. As shown in FIG. 21, an insulator 322 is then deposited upon the third conductor 328. As shown in FIG. 22, a fourth conductor 370 is then deposited upon the insulator 322. Preferably, the fourth conductor 370 fills the first opening as shown in FIG. 22.

Figure 23:
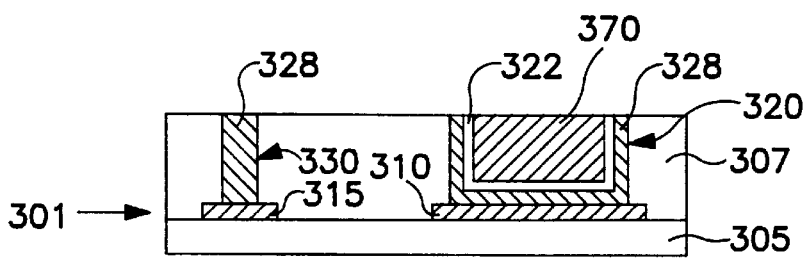

The fourth conductor 370, insulator 322, and third conductor 328 are then planarized to the second interlevel dielectric 307 as shown in FIG. 23. Preferably, chemical-mechanical polishing is used to planarize the apparatus to the second interlevel dielectric 307.

Figure 24:
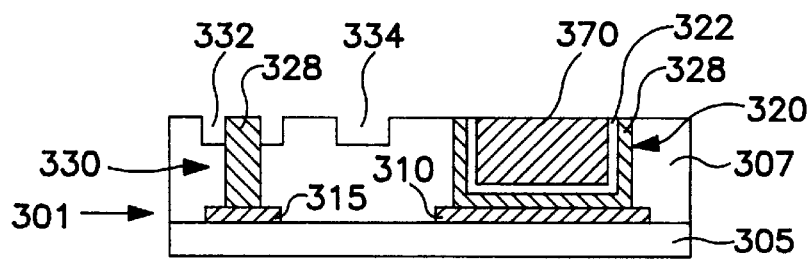

As shown in FIG. 24, a trench 332 is formed in the upper portion of the second opening 330. An additional trench 334 is simultaneously formed. The trenches 332, 334 may be used as interconnects on the second interconnect layer 302 (shown in FIG. 28). The trenches 332, 334 may be formed using lithography and RIE, for example. The insulator 322, third conductor 328, and fourth conductor 370 in the first opening 320 are protected by a resist (not shown) while the trenches 332, 344 are formed. Preferably, the trench 332 has a width greater than the width of the opening 330 and does not extend into the second interlevel dielectric 307 to the depth of the second conductive interconnect 315 of the first interconnect layer 301.

Figure 25:
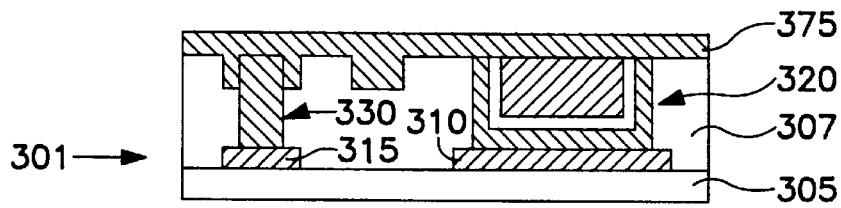
Figure 26:
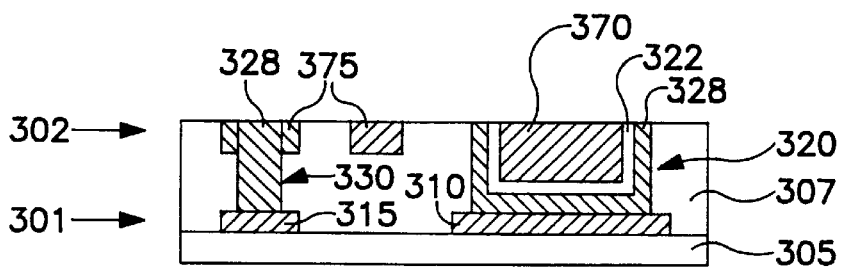

As shown in FIG. 25, a fifth conductor 375 is deposited upon the insulator 322, the third and fourth conductors 328, 370, the second interlevel dielectric 307, and filling the trenches 332, 334. The fifth conductor 375 is then planarized to the second interlevel dielectric 307 as shown in FIG. 26. Preferably, chemical-mechanical polishing is used to planarize the apparatus to the second interlevel dielectric 307.

Figure 27:
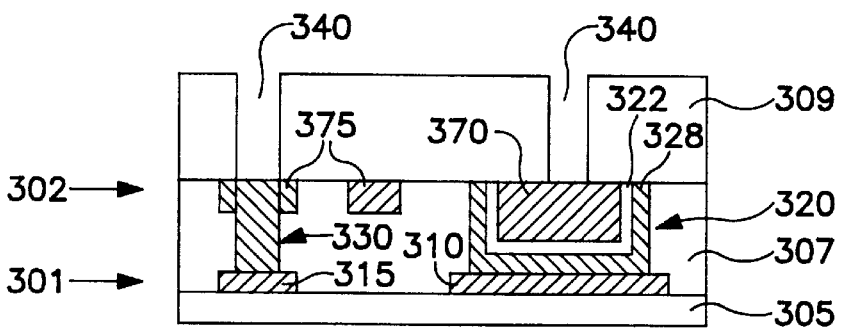

The remaining steps as illustrated in FIGS. 27–28 are similar to the method described above with respect to FIGS. 8–10 and for brevity will not be repeated. The third embodiment described above provides an advantage of having the first opening 320 filled with the fourth conductor 370 before planarizing to the second interlevel dielectric 307. Thus, the slurry used when planarizing by CMP does not drop into the first opening 320. The methods according to the present invention reduce manufacturing costs by integrating the patterning of the insulator 322 with the formation of trenches 332 in a single manufacturing step. Forming a conductor-insulator-conductor structure by simultaneously patterning the insulator 322 while forming trenches 332 for conductive interconnects reduces manufacturing costs by not requiring an additional lithographic step to pattern the insulator 322.

The present invention provides a method of manufacturing a planar conductor-insulator-conductor device which reduces focusing problems during lithography. The cross section of a conductor-insulator-conductor structure manufactured according to the methods of this invention is determined by the cross section of the opening in which the structure is formed. This allows the manufacture of a small cross-sectional structure without using a separate masking step.

As known to those skilled in the art, the materials used in manufacturing an apparatus according to the present invention vary depending on desired device parameters. For example, materials chosen for an antifuse device will vary with the desired difference in resistance between the high resistance state and the low resistance state.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for manufacturing an integrated circuit including a capacitor, comprising the steps of:
    (a) forming a first conductive interconnect and a second conductive interconnect upon a first interlevel dielectric;
    (b) depositing a second interlevel dielectric upon the first conductive interconnect, upon the second conductive interconnect, and upon the first interlevel dielectric;
    (c) forming a first opening corresponding to the first conductive interconnect, the first opening having sidewalls and a bottom and extending through the second interlevel dielectric to the first conductive interconnect, and a second opening corresponding to the second conductive interconnect, the second opening having sidewalls, a bottom, a second opening width, and a second opening depth and extending through the second interlevel dielectric to the second conductive interconnect;
    (d) depositing a third conductor in the second opening;
    (e) depositing an insulator upon the second interlevel dielectric, upon the sidewalls and bottom of the first opening, upon the sidewalls of the second opening, and upon the third conductor in the second opening;
    (f) forming a trench in the second interlevel dielectric through the insulator, the trench corresponding to the second opening wherein the insulator upon the third conductor in the second opening is simultaneously removed while forming the trench; and
    (g) depositing a first conductor upon the insulator and filling the first opening, the second opening, and the trench with the first conductor.

2. The method according to claim 1 wherein step (d) comprises
    depositing the third conductor upon the second interlevel dielectric and in the first and second openings; and
    removing the third conductor from the first opening and from upon the second interlevel dielectric.

3. The method according to claim 1 wherein the trench has a width greater than the second opening width and a depth less than the second opening depth and a bottom wherein the third conductor in the corresponding second opening protrudes through the bottom of the trench.

4. The method according to claim 1 wherein the first opening is overfilled with the first conductor in step (g) and the method further comprises the step of patterning the first conductor.

5. The method according to claim 4 wherein the first conductor is patterned using chemical-mechanical polishing.

6. The method according to claim 1 wherein the third conductor does not fill the second opening and the insulator on the sidewalls of the second opening is removed before depositing the first conductor.

7. The method according to claim 1 wherein the sidewalls of the first opening are parallel.

8. The method according to claim 1 further comprising the steps of:
    (h) depositing a third interlevel dielectric upon the second interlevel dielectric, upon the first conductor in the first opening, upon the first conductor in the trench, and upon the insulator on the sidewalls of the first opening;
    (i) forming third openings corresponding to the first opening and extending through the third interlevel dielectric to the corresponding first opening, and corresponding to the trench and extending through the third interlevel dielectric to the corresponding trench;
    (j) overfilling the third openings with a second conductor; and
    (k) patterning the second conductor.

9. The method according to claim 8 wherein step (k) comprises etching the second conductor.

10. The method according to claim 1 wherein the first conductive interconnect and the second conductive interconnect are formed by a damascene process.

11. The method according to claim 1 wherein the insulator is deposited in step (e) using one of physical vapor deposition, chemical vapor deposition, and plasma enhanced chemical vapor deposition.

12. The method according to claim 11 wherein the insulator is deposited in step (e) using chemical vapor deposition.

13. The method according to claim 11 wherein the insulator is deposited in step (e) using plasma enhanced chemical vapor deposition.

14. The method according to claim 1 wherein the trench is formed using reactive ion etching.

15. The method according to claim 1 wherein step (b) further comprises planarizing the second interlevel dielectric.

16. The method according to claim 1 wherein the first and second openings are formed in step (c) by reactive ion etching.

17. The method according to claim 1 further comprising, in step (f), forming a trench corresponding neither to the first opening nor to the second opening.

18. A method for manufacturing an integrated circuit including a capacitor, comprising the steps of:
(a) forming a first conductive interconnect and a second conductive interconnect upon a first interlevel dielectric, using one of a damascene process and reactive ion etching;
(b) depositing a second interlevel dielectric upon the first conductive interconnect, upon the second conductive interconnect, and upon the first interlevel dielectric;
(c) forming a first opening corresponding to the first conductive interconnect, the first opening having sidewalls and a bottom and extending through the second interlevel dielectric to the first conductive interconnect, and a second opening corresponding to the second conductive interconnect, the second opening having sidewalls, a bottom, a second opening width, and a second opening depth and extending through the second interlevel dielectric to the second conductive interconnect, wherein the sidewalls of the first and second openings are parallel;
(d) depositing a third conductor upon the second interlevel dielectric and in the first and second openings;
(e) removing the third conductor from the first opening and from upon the second interlevel dielectric;
(f) depositing an insulator upon the second interlevel dielectric, upon the sidewalls and bottom of the first opening, upon the sidewalls of the second opening, and upon the third conductor in the second opening, using one of physical vapor deposition, chemical vapor deposition, and plasma enhanced chemical vapor deposition;
(g) etching a trench in the second interlevel dielectric through the insulator, the trench corresponding to the second opening wherein the trench has a width greater than the second opening width and a depth less than the second opening depth and a bottom wherein the third conductor in the corresponding second opening protrudes through the bottom of the trench and the insulator upon the third conductor in the second opening is simultaneously removed while forming the trench;
(h) depositing a first conductor upon the insulator and overfilling the first opening, the second opening, and the trench with the first conductor;
(i) patterning the first conductor using chemical-mechanical polishing;
(j) depositing a third interlevel dielectric upon the second interlevel dielectric, upon the first conductor in the first opening, upon the first conductor in the trench, and upon the insulator on the sidewalls of the first opening;
(k) forming third openings corresponding to the first opening and extending through the third interlevel dielectric to the corresponding first opening, and corresponding to the trench and extending through the third interlevel dielectric to the corresponding trench;
(l) overfilling the third openings with a second conductor; and
(m) patterning the second conductor.

19. The method according to claim 18 wherein the third conductor does not fill the second opening and the insulator on the sidewalls of the second opening is removed before depositing the first conductor.

20. The method according to claim 18 wherein step (m) comprises etching the second conductor.

21. The method according to claim 18 wherein the insulator is deposited in step (f) using chemical vapor deposition.

22. The method according to claim 18 wherein the insulator is deposited in step (f) using plasma enhanced chemical vapor deposition.

23. The method according to claim 18 wherein the first and second openings are formed in step (c) by reactive ion etching.

24. A method for manufacturing an integrated circuit including a capacitor, comprising the steps of:
(a) forming a first conductive interconnect and a second conductive interconnect upon a first interlevel dielectric;
(b) depositing a second interlevel dielectric upon the first conductive interconnect, upon the second conductive interconnect, and upon the first interlevel dielectric;
(c) forming a first opening corresponding to the first conductive interconnect, the first opening having sidewalls and a bottom and extending through the second interlevel dielectric to the first conductive interconnect, and a second opening corresponding to the second conductive interconnect, the second opening having sidewalls, a bottom, a second opening width, and a second opening depth and extending through the second interlevel dielectric to the second conductive interconnect;
(d) depositing a third conductor upon the second interlevel dielectric, in the first opening, and in the second opening wherein the second opening is overfilled with the third conductor and the third conductor forms a blanket layer in the first opening;
(e) depositing an insulator upon the third conductor;
(f) depositing a fourth conductor upon the insulator; and
(g) planarizing the third conductor, the fourth conductor, and the insulator to the second interlevel dielectric.

25. The method according to claim 24 further comprising the steps of:
(h) forming a trench having a bottom in the second interlevel dielectric corresponding to the second opening wherein the third conductor in the second opening protrudes through the bottom of the trench;
(i) depositing a fifth conductor upon the second interlevel dielectric and filling the trench with the fifth conductor; and
(j) planarizing the fifth conductor to the second interlevel dielectric.

26. The method according to claim 25 further comprising the steps of:

(k) depositing a third interlevel dielectric upon the second interlevel dielectric, upon the third conductor in the first opening; upon the fourth conductor in the first opening, upon the fifth conductor in the trench, and upon the insulator in the first opening;

(l) forming third openings corresponding to the first opening and extending through the third interlevel dielectric to the fourth conductor in the corresponding first opening, and corresponding to the trench and extending through the third interlevel dielectric to the corresponding trench;

(m) overfilling the third openings with a second conductor; and (n) patterning the second conductor.

27. The method according to claim 24 wherein the third conductor, the fourth conductor, and the insulator are planarized in step (g) using chemical-mechanical polishing.

28. The method according to claim 24 wherein the insulator is deposited in step (e) using one of physical vapor deposition, chemical vapor deposition, and plasma enhanced chemical vapor deposition.

* * * * *